(12) United States Patent
Choi et al.

(10) Patent No.: US 8,183,771 B2
(45) Date of Patent: May 22, 2012

(54) ORGANIC LIGHT EMITTING DIODE AND METHOD OF FABRICATING THE SAME

(75) Inventors: Sung-Jin Choi, Yongin (KR); Ok-Keun Song, Yongin (KR); Hye-In Jeong, Yongin (KR); Doo-Hwan Kim, Yongin (KR); Min-Woo Lee, Yongin (KR); Jae-Goo Lee, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 204 days.

(21) Appl. No.: 12/479,655

(22) Filed: Jun. 5, 2009

(65) Prior Publication Data

US 2009/0302759 A1 Dec. 10, 2009

(30) Foreign Application Priority Data

Jun. 5, 2008 (KR) .................. 10-2008-0053340

(51) Int. Cl.
 *H01J 1/62* (2006.01)
(52) U.S. Cl. .................. 313/507; 313/504; 445/24
(58) Field of Classification Search .................. 313/504, 313/507; 445/23, 24
 See application file for complete search history.

(56) References Cited

U.S. PATENT DOCUMENTS

| 2005/0106412 A1* | 5/2005 | Kathirgamanathan | 428/690 |
| 2006/0105201 A1* | 5/2006 | Lee et al. | 428/690 |
| 2008/0116790 A1* | 5/2008 | Kho et al. | 313/504 |
| 2008/0157663 A1* | 7/2008 | Sung et al. | 313/504 |
| 2008/0297036 A1* | 12/2008 | Noh et al. | 313/504 |
| 2009/0079333 A1* | 3/2009 | Koo | 313/504 |
| 2009/0096357 A1* | 4/2009 | Lee et al. | 313/504 |

FOREIGN PATENT DOCUMENTS

| JP | 2001-291591 | 10/2001 |
| KR | 2003-0067773 | 8/2003 |
| KR | 10-2005-0050488 | 5/2005 |
| KR | 10-2005-0072247 | 7/2005 |
| KR | 10-2006-0000745 | 1/2006 |
| KR | 10-2006-0001348 | 1/2006 |
| KR | 10-2006-0092760 | 8/2006 |
| KR | 10-2007-0013002 | 1/2007 |
| KR | 10-0672535 | 1/2007 |
| WO | WO 00/32717 | 6/2000 |
| WO | WO 2007/029696 A1 | 3/2007 |

OTHER PUBLICATIONS

KIPO Notice of Allowance dated Aug. 29, 2009, for priority Korean application 10-2008-0053340, noting listed references in this IDS.

* cited by examiner

*Primary Examiner* — Joseph L Williams
*Assistant Examiner* — Brenitra Lee
(74) *Attorney, Agent, or Firm* — Christie, Parker & Hale, LLP

(57) ABSTRACT

An organic light emitting diode and a method of fabricating the same. The organic light emitting diode includes a substrate, a first electrode on the substrate, emission layers on the first electrode including red, green and blue pixel regions, and a second electrode on the emission layers. The organic light emitting diode further includes an electron transport layer on the emission layers, and an intermediate layer formed by co-depositing metal quinolate and an organic material between at least one of the emission layers and the electron transport layer. The intermediate layer inhibits hole transport and increases a life span of the red pixel region.

16 Claims, 3 Drawing Sheets

ORGANIC LIGHT EMITTING DIODE AND METHOD OF FABRICATING THE SAME

CROSS-REFERENCE TO RELATED APPLICATION

This application claims the benefit of Korean Patent Application No. 2008-53340, filed Jun. 5, 2008 in the Korean Intellectual Property Office, the disclosure of which is hereby incorporated herein by reference in its entirety.

BACKGROUND

1. Field of the Invention

The present invention relates to a full color organic light emitting diode (OLED) and a method of fabricating the same.

2. Description of the Related Art

Generally, an organic light emitting diode (OLED) display device is a display device which emits light when electrons and holes injected into an emission layer from an electron injection electrode, i.e., a cathode, and a hole injection electrode, i.e., an anode, are recombined with each other to create excitons that transition from an excited state to a ground state.

Thus, unlike a conventional liquid crystal display device, the OLED display device does not need a separate light source, and thus can be decreased in volume and weight.

The OLED display devices may be classified into a passive matrix type and an active matrix type according to a driving method.

The passive matrix OLED display device has a relatively simple structure fabricated by a relatively simple method, but requires higher power consumption and is difficult to form into a large-sized display. Also, in the passive matrix OLED display device, an aperture ratio decreases as the number of interconnections increases.

Accordingly, for small-sized display devices, passive matrix OLED display devices are frequently used, whereas for large-sized display devices, active matrix OLED display devices are frequently used.

Further, OLED display devices may be classified into bottom-emission types and top-emission types according to the direction of light generated from an emission layer. The bottom-emission type display emits light toward a substrate utilizing a reflective electrode or a reflective layer as an upper electrode, and a transparent electrode as a lower electrode. Here, in the active matrix OLED display device having a thin film transistor, because light generally cannot penetrate the thin film transistor part, the aperture ratio, or the area through which light passes, may be reduced. On the other hand, the top-emission type display emits light away from the substrate, utilizing a transparent electrode as an upper electrode and a reflective electrode or a reflective layer as a lower electrode. Thus, the aperture ratio, or the area through which light passes, is increased, and brightness can be improved.

Meanwhile, in a full color OLED display device including blue, red and green pixel regions, the red pixel region has a relatively shorter afterimage life span than the green and blue pixel regions, and thus full color reproduction by the device may be degraded.

SUMMARY OF THE INVENTION

Some aspects of the present invention provide a full color organic light emitting diode and a method of fabricating the same, which can improve color reproducibility by increasing the life span of a red emission layer in a red pixel region by interposing an intermediate layer having metal quinolate and an organic material between the red emission layer and an electron transport layer in a red pixel region.

According to an exemplary embodiment of the present invention, an organic light emitting diode (OLED) includes a substrate; a first electrode on the substrate; emission layers on the first electrode, including red, green and blue pixel regions; and a second electrode on the emission layers. The organic light emitting diode further includes an electron transport layer on the emission layers; and an intermediate layer including metal quinolate and an organic material between at least one of the emission layers and the electron transport layer.

According to another exemplary embodiment of the present invention, a method of fabricating an OLED includes forming a first electrode on a substrate; forming emission layers including red, green and blue pixel regions on the first electrode; forming an intermediate layer including metal quinolate and an organic material on at least one of the emission layers; forming an electron transport layer on the red, green, and blue pixel regions; and forming a second electrode on the electron transport layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and features of the invention will become apparent and more readily appreciated from the following description of exemplary embodiments, taken in conjunction with the accompanying drawings of which.

DETAILED DESCRIPTION

Figure 1A:
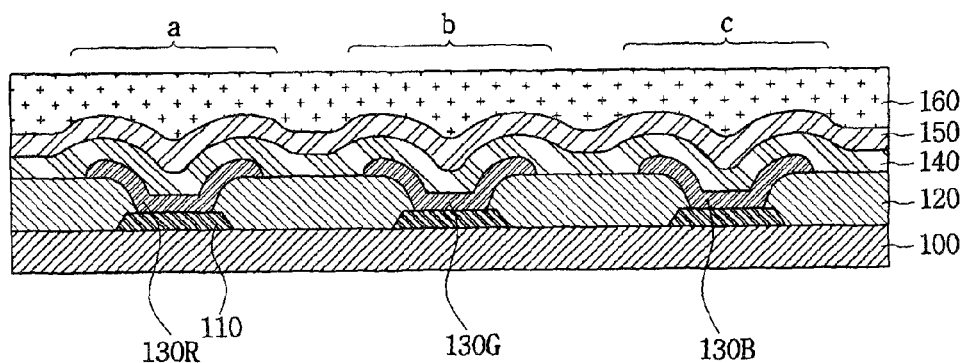
FIGS. 1A, 1C, and 1D are cross-sectional views of organic light emitting diodes according to exemplary embodiments of the present invention.

Reference will now be made in detail to embodiments of the present invention, examples of which are illustrated in the accompanying drawings, wherein like reference numerals refer to the like elements throughout.

Figure 1B:
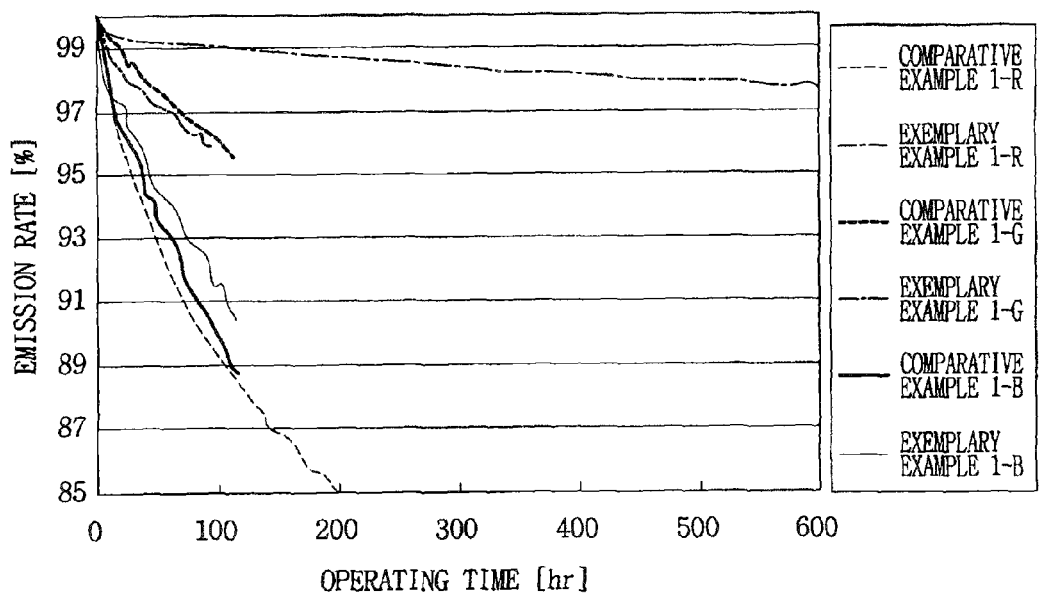
FIG. 1B is a graph of operating time versus emission rate in the organic light emitting diodes according to the first exemplary embodiment of the present invention.
Figure 1C:
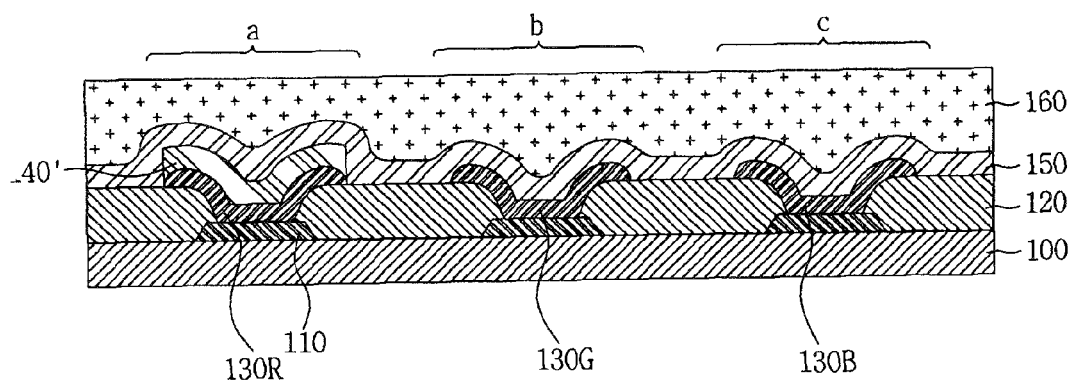
Figure 1D:
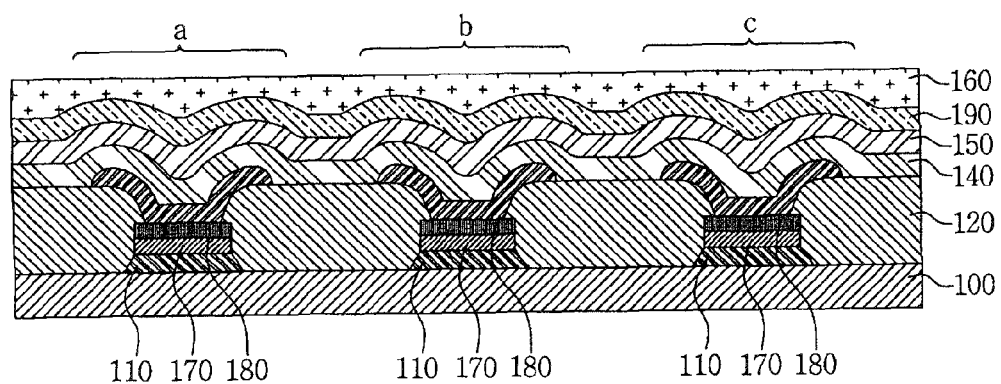

FIGS. 1A, 1C, and 1D are cross-sectional views of organic light emitting diodes according to exemplary embodiments of the present invention, and FIG. 1B is a graph of operating time versus emission rate in the organic light emitting diodes according to the first exemplary embodiment of the present invention.

Referring to FIG. 1A, first electrodes 110 are formed and patterned on a glass or plastic substrate 100, and red, green and blue pixel regions a, b and c, respectively, defined by insulating layers 120, are formed on the first electrodes 110. Red, green and blue emission layers 130R, 130G and 130B are formed on the red, green and blue pixel regions a, b, and c, respectively.

In the case of a top-emission type display, the first electrodes 110 include a metal layer as a reflective layer, and in the case of a bottom-emission type, the first electrodes 110 include an indium tin oxide (ITO) or indium zinc oxide (IZO) layer as transparent electrodes. When the first electrodes 110 are cathode electrodes, a second electrode 160 to be described below is an anode electrode. Alternatively, when the first electrodes 110 are anode electrodes, the second electrode 160 is a cathode electrode.

In a further embodiment as illustrated in FIG. 1D, a hole injection layer 170 and/or a hole transport layer 180 may be included between the first electrode and each emission layer. Here, the hole injection layer 170 is generally formed of a small-molecule material such as CuPc, TNATA, TCTA or TDAPB, or a polymer material such as PANI or PEDOT, and the hole transport layer 180 is generally formed of an arylamine-, hydrazone-, stilbenzene- or starburst-based small molecule material such as NPB, TPD, s-TAD or MTADATA, or a carbazole-, arylamine-, perylene- or pyrrole-based polymer material such as PVK. The hole injection layer 170 or the hole transport layer 180 is generally formed by vacuum deposition or sputtering.

After forming the red, green and blue emission layers 130R, 130G, and 130B, an intermediate layer 140 is formed on the entire surface of the substrate.

Here, the intermediate layer 140 is formed by co-depositing metal quinolate and an organic material. The organic material serves to transport electrons.

The metal quinolate may include one or more of lithium quinolate, sodium quinolate, cesium quinolate and kalium quinolate. The material serving to transport electrons may include one or more of Alq3, DPB and BeBq2.

Further, the intermediate layer 140 according to this embodiment includes 30 to 70% by weight (30 to 70 w %) metal quinolate, and in this range, the red pixel region exhibits a beneficially long life span, and the device facilitates mass production.

The intermediate layer 140 is formed to a thickness of 50 to 300 Å, and preferably 100 to 150 Å. When the intermediate layer 140 has a thickness ranging from 50 to 300 Å, it can inhibit hole transport, and inhibit or prevent an increase in driving voltage.

FIG. 1B is a graph of operating time versus emission rate in the diode with and without an intermediate layer 14c as described above.

Referring to FIG. 1B, in Exemplary Example 1 having an intermediate layer as described above, emission rates of green and blue emission layers (G and B in Exemplary Example 1) are not very different from those of green and blue emission layers (G and B in Comparative Example 1). However, an emission rate of a red emission layer R in Exemplary Example 1 is substantially greater than that of a red emission layer R in Comparative Example 1. Thus, the intermediate layer is very effective for increasing an emission rate of the red emission layer.

Returning to FIG. 1A, an electron transport layer 150 is subsequently formed on the intermediate layer 140. The electron transport layer 150 can be formed of any material generally used in this field, and is not limited to any particular structure or method in the present invention. For example, the electron transport layer may be formed of an inorganic material such as LiF or Ca, a quinoline derivative metal complex such as Alq3(tris(8-quinolinol)aluminum), an oxadiazole derivative such as 2,5-bis(1-naphthly)-1,3,4-oxadiazole (BND) or 2-(4-tert-butylphenyl)-5-(4-biphenylyl)-1,3,4-oxadiazole (PBD), or a triazole derivative.

As in the exemplary embodiment illustrated in FIG. 1D, the electron injection layer 190 is generally formed of a small-molecule material such as Alq3, Ga complex or PBD, or an oxadiazole-based polymer material. The electron injection layer 190 is commonly formed by a method such as spin coating, dip coating, extrusion coating, knife coating, vacuum deposition, or chemical vapor deposition.

Subsequently, a second electrode 160 is formed on the substrate 100. The second electrode 160 is formed as a transparent electrode in the top emission type display, and formed in a structure in which a transparent electrode material is stacked on a reflective plate or a metal as a reflective layer in the bottom emission type display.

As described above, the intermediate layer 140 is formed on the entire surfaces of the red, green and blue emission layers 130R, 130G, and 130B, but only significantly affects the red emission layer 130R. Thus, the intermediate layer 140 may be formed by co-depositing metal quinolate and an organic material to inhibit hole transport and increase a life span of the red pixel region. Accordingly, compared to the blue and green emission layers, the red emission layer can have a longer life span, and thus color reproducibility can be improved in a full color OLED display device.

The red emission layer 130R may be formed of a small-molecule material such as Alq3 or CBP, or a polymer material such as a PFO-based polymer material or a PPV-based polymer material. The green emission layer 130G may be formed of a small-molecule material such as Alq3 or BGP, a PFO-based polymer material or a PPV-based polymer material. And, the blue emission layer 130B may be formed of a small-molecule material such as DPVBi, spiro-DPVBi, spiro-6P, distyryl benzene (DSB) or distyryl arylene (DSA), or a PFO- or PPV-based polymer material. That is, any material commonly used in this field may be used.

Referring to FIG. 1C, since the intermediate layer works even when formed only on the red emission layer 130R, an intermediate layer 140' may be patterned only on the red emission layer 130R, and the electron transport layer 150 and the second electrode 160 may be formed on the entire surface of the substrate, thus completing the diodes.

EXEMPLARY EXAMPLE 1

A hole injection layer was formed to a thickness of 1000 Å using NPB on a first electrode in a red emission region, and an emission layer was formed to a thickness of 400 Å using RD3 (Kodak®) on the hole injection layer. Then, an intermediate layer was formed to a thickness of 150 Å by co-depositing Alq3 and lithium quinolate in the same amounts, and an electron transport layer was formed to a thickness of 250 Å using Alq3. After that, a second electrode was formed. Kodak® is a registered trademark of Eastman Kodak Company of Rochester, N.Y., a New Jersey Corporation.

EXEMPLARY EXAMPLE 2

A hole injection layer was formed to a thickness of 1000 Å using NPB on a first electrode in a red emission region, and an emission layer was formed to a thickness of 400 Å using RD3 (Kodak®) on the hole injection layer. Then, an intermediate layer was formed to a thickness of 150 Å by co-depositing 9,10-bis(2-naphthyl)anthracene and lithium quinolate in the same amounts, and an electron transport layer was formed to a thickness of 250 Å using Alq3. After that, a second electrode was formed.

COMPARATIVE EXAMPLE 1

A hole injection layer was formed to a thickness of 1000 Å using NPB on a first electrode in a red emission region, and an emission layer was formed to a thickness of 400 Å using RD3 (Kodak®) on the hole injection layer. Then, an electron transport layer was formed to a thickness of 250 Å using Alq3. After that, a second electrode was formed.

COMPARATIVE EXAMPLE 2

A hole injection layer was formed to a thickness of 1000 Å using NPB on a first electrode in a red emission region, and an emission layer was formed to a thickness of 400 Å using RD3 (Kodak®) on the hole injection layer. Then, an intermediate layer was formed to a thickness of 150 Å using Alq3, and an electron transport layer was formed to a thickness of 250 Å using Alq3. After that, a second electrode was formed.

Table 1 shows characteristic data of a red light emitting diode according to an exemplary embodiment of the present invention.

TABLE 1

| No. | Voltage (V) | luminance (cd/m$^2$) | Emission Efficiency (cd/A) | Power Efficiency (lm/W) | Color Coordinates (CIE x) | Color Coordinates (CIE y) |
|---|---|---|---|---|---|---|
| E. example 1 | 4.8 | 7609 | 7.6 | 5.0 | 0.665 | 0.333 |
| E. example 2 | 4.7 | 7382 | 7.4 | 4.9 | 0.667 | 0.333 |
| C. example 1 | 4.1 | 6986 | 7.0 | 5.4 | 0.665 | 0.335 |
| C. example 2 | 4.4 | 7603 | 7.6 | 5.5 | 0.668 | 0.332 |

Referring to Table 1, Exemplary Examples 1 and 2 having an intermediate layer exhibit higher luminance and emission efficiency than Comparative Example 1 which does not have an intermediate layer.

Further, it can be noted that Exemplary Examples 1 and 2 having the intermediate layer formed by co-depositing metal quinolate and an organic material exhibit substantially the same emission efficiency characteristics as Comparative Example 2 having the intermediate layer formed of only an organic material.

Figure 2:
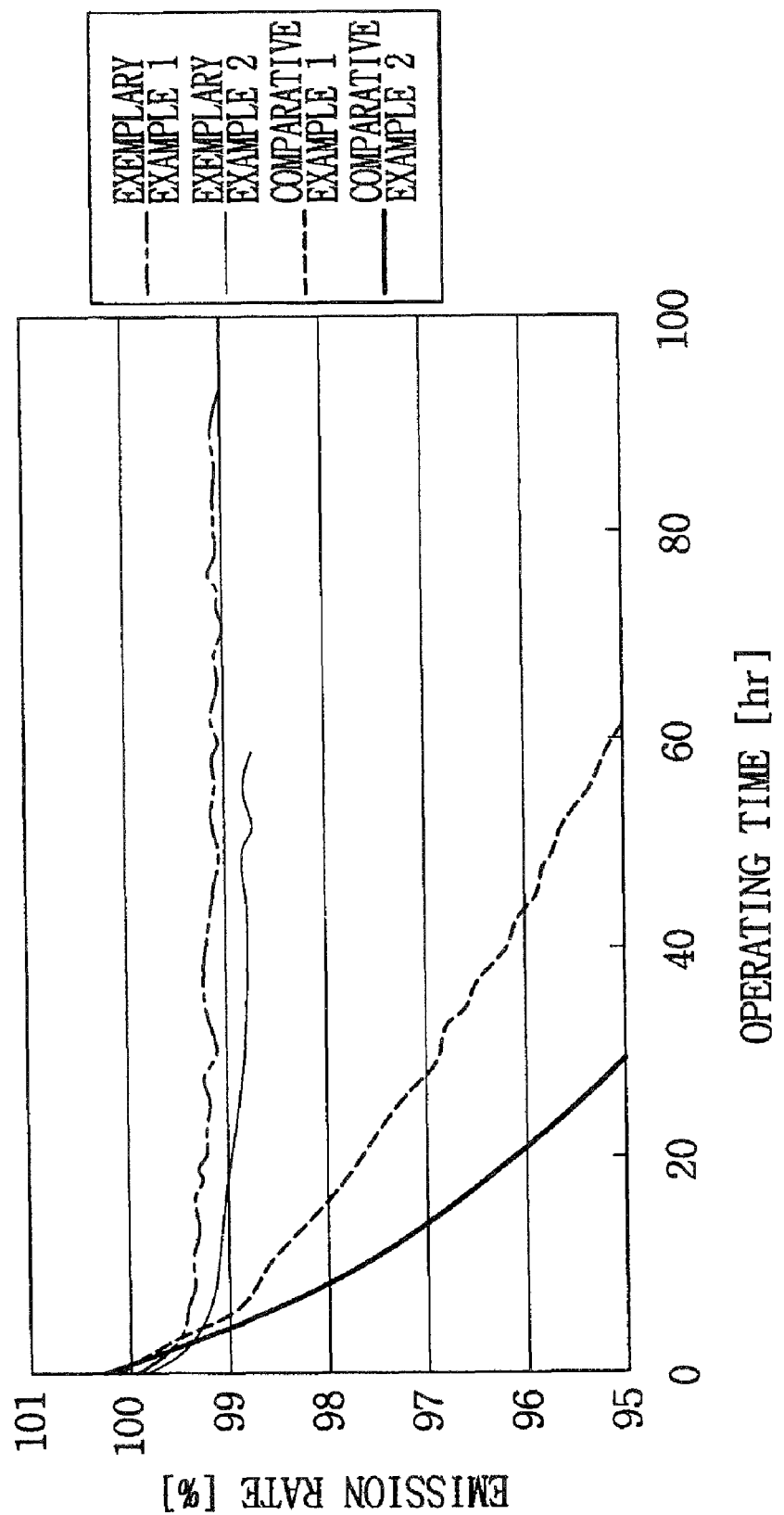
FIG. 2 is a graph of operating time versus emission rate in a red light emitting diode when an intermediate layer is interposed according to an exemplary embodiment of the present invention.

FIG. 2 is a graph of operating time versus emission rate in a red light emitting diode when an intermediate layer is interposed according to Exemplary Examples 1 and 2, and Comparative Examples 1 and 2.

Referring to FIG. 2, it can be noted that Exemplary Examples 1 and 2 having the intermediate layer, which is formed of metal quinolate and an organic material for transporting electrons interposed between emission layers, exhibit excellent emission efficiency as time passes compared to Comparative Examples 1 and 2, and thus the life span is increased.

Thus, according to various embodiments of the present invention, the intermediate layer is interposed between the red emission layer and the electron transport layer in the red pixel region, which makes up for a shorter afterimage life span than other emission regions. That is, the time prior to the emergence of an afterimage in the display device. Thus, the full color OLED display device can exhibit an improved color reproducibility.

As described above, according to various embodiments of the present invention, an intermediate layer including metal quinolate and an organic material is interposed between a red emission layer and an electron transport layer in a red pixel region, so that the red emission layer can have a longer life span, and thus color reproducibility of red, blue and green colors can be improved.

Although a few embodiments of the present invention have been shown and described, it will be appreciated by those skilled in the art that changes may be made to these embodiments without departing from the principles and spirit of the invention, the scope of which is defined in the claims and their equivalents.

What is claimed is:

1. Organic light emitting diodes, comprising:
   a substrate;
   a plurality of first electrodes on the substrate;
   emission layers on the first electrodes, the emission layers corresponding to red, green and blue pixel regions, respectively;
   a second electrode on the emission layers;
   an electron transport layer between the emission layers and the second electrode; and
   an intermediate layer comprising metal quinolate and an organic material between at least one of the emission layers and the electron transport layer.

2. The organic light emitting diodes according to claim 1, wherein the metal quinolate comprises at least one material selected from the group consisting of lithium quinolate, sodium quinolate, cesium quinolate, and kalium quinolate.

3. The organic light emitting diodes according to claim 1, wherein the organic material comprises a material for transporting electrons.

4. The organic light emitting diodes according to claim 3, wherein the organic material comprises at least one material selected from the group consisting of Alq3, DPB, and BeBq2.

5. The organic light emitting diodes according to claim 1, wherein the intermediate layer comprises 30 to 70 w % metal quinolate.

6. The organic light emitting diodes according to claim 1, wherein the intermediate layer is between approximately 50 Å and 300 Å thick.

7. The organic light emitting diodes according to claim 6, wherein the intermediate layer is between approximately 100 Å and 150 Å thick.

8. The organic light emitting diodes according to claim 1, further comprising a hole injection layer and a hole transport layer between the first electrode and the emission layers.

9. The organic light emitting diodes according to claim 1, further comprising an electron injection layer between the electron transport layer and the second electrode.

10. The organic light emitting diodes according to claim 1, wherein the emission layers comprise red, green and blue emission layers, and the intermediate layer is between the red emission layer and the electron transport layer.

11. A method of fabricating organic light emitting diodes, comprising:
   forming a plurality of first electrodes on a substrate;
   forming emission layers corresponding to red, green, and blue pixel regions, respectively, on the first electrode;
   forming an intermediate layer comprising metal quinolate and an organic material on at least one of the emission layers;
   forming an electron transport layer on the red, green, and blue pixel regions; and
   forming a second electrode on the electron transport layer.

12. The method according to claim 11, wherein forming the intermediate layer comprises co-depositing the metal quinolate and the organic material.

13. The method according to claim 11, wherein the intermediate layer comprises 30 to 70 w % metal quinolate.

14. The method according to claim 11, wherein the intermediate layer is between approximately 50 Å and 300 Å thick.

15. The method according to claim 14, wherein the intermediate layer is between approximately 100 Å and 150 Å thick.

16. The method according to claim 11, wherein the intermediate layer is formed on the emission layer corresponding to the red pixel region.

* * * * *